United States Patent [19]

Fuse

[11] Patent Number: 5,598,133
[45] Date of Patent: Jan. 28, 1997

[54] LADDER FILTER CONTAINING PIEZORESONATOR WITH CONDUCTIVE ELASTIC SHEET

[75] Inventor: Kenji Fuse, Nagaokakyo, Japan

[73] Assignee: Murata Manufacturing Co., Ltd., Japan

[21] Appl. No.: 447,423

[22] Filed: May 23, 1995

Related U.S. Application Data

[63] Continuation of Ser. No. 147,161, Nov. 3, 1993, abandoned.

[30] Foreign Application Priority Data

Nov. 5, 1992  [JP]  Japan ................................ 4-295674

[51] Int. Cl.$^6$ ........................... H03H 9/00; H03H 9/58
[52] U.S. Cl. .................. 333/189; 333/190; 333/186; 310/348
[58] Field of Search ...................... 333/187–192; 310/348

[56] References Cited

U.S. PATENT DOCUMENTS

| | | | |
|---|---|---|---|
| 4,353,045 | 10/1982 | Matsui et al. | 333/190 |
| 4,656,385 | 4/1987 | Tanaka | 333/189 |
| 4,737,742 | 4/1988 | Takeshima et al. | 310/348 |
| 4,864,259 | 9/1989 | Takamoro et al. | 333/189 |
| 5,057,802 | 10/1991 | Ozaki et al. | 333/189 |
| 5,260,675 | 11/1993 | Ogama et al. | 310/348 |
| 5,392,012 | 2/1995 | Iwata et al. | 333/189 |

FOREIGN PATENT DOCUMENTS

| | | | |
|---|---|---|---|
| 0210714 | 11/1984 | Japan . | |
| 0210713 | 11/1984 | Japan | 333/189 |
| 4-252607 | 9/1992 | Japan | 333/190 |

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A ladder filter wherein an inside of a case is partitioned by a vertical partition wall into four containing portions. Each containing portion contains at least one piezoresonator, and an input terminal, an output terminal and junction terminals are portioned out into the containing portions. A grounding terminal is contained at a bottom of the case.

3 Claims, 7 Drawing Sheets

LADDER FILTER CONTAINING PIEZORESONATOR WITH CONDUCTIVE ELASTIC SHEET

This is a Continuation of application Ser. No. 08/147,161 filed on Nov. 3, 1993, now abandoned.

BACKGROUND OF THE INVENTION

1. Field of the invention

The present invention relates to a ladder filter, and more particularly to a ladder filter which is used in a communicating machine, a transceiver, and a cordless telephone.

2. Description of Related Art

Conventionally, as a ladder filter for eliminating noise, a rudder filter wherein piezoresonators which are connected in series and piezoresonators which are connected in parallel are connected alternately between an input terminal and an output terminal is well known.

In the conventional ladder filter, all internal components such as the piezoresonators and the input terminal and the output terminal are stacked together contained in a housing. Thus, the filter is tall and results in useless space when the filter is mounted on a printed circuit board and installed in an electronic machine. Also, the structure of such a filter is not suitable for automatic assembly.

SUMMARY OF THE INVENTION

An object of the present invention is to provide a short ladder filter which is suitable for automatic assembly.

In order to attain the object, a ladder filter according to the present invention is a ladder filter wherein piezoresonators which are connected in series and piezoresonators which are connected in parallel between the input terminal and the output terminal are connected alternately. An inside of a case for the filter is partitioned vertically into a plurality of containing portions. At least one piezoresonator is contained in each containing portion, and the input terminal and the output terminal and a grounding terminal are stacked in the containing portions.

In the above structure, the internal components such as the piezoresonators, the input terminal and the output terminal are portioned out horizontally into the plurality of containing portions and stacked thereon. Thus, the number of rows of piled internal components becomes smaller, which makes the filter easier to be assembled, and therefore, a ladder filter which is shorter than the conventional one can be provided. Also, automatic assembly can be used in such a structure, since the assembling can be done by distributing the internal components successively to the containing portions and piling them up thereon.

BRIEF DESCRIPTION OF THE DRAWINGS

This and other objects and features of the present invention will become apparent from the following description with reference to the accompanying drawings, in which.

DETAILED DESCRIPTION OF THE PREFERRED EMBODIMENTS

The description of preferred embodiments according to the present invention is given below, referring to the accompanying drawings.

First Embodiment: FIGS. 1 through 4

Figure 1:
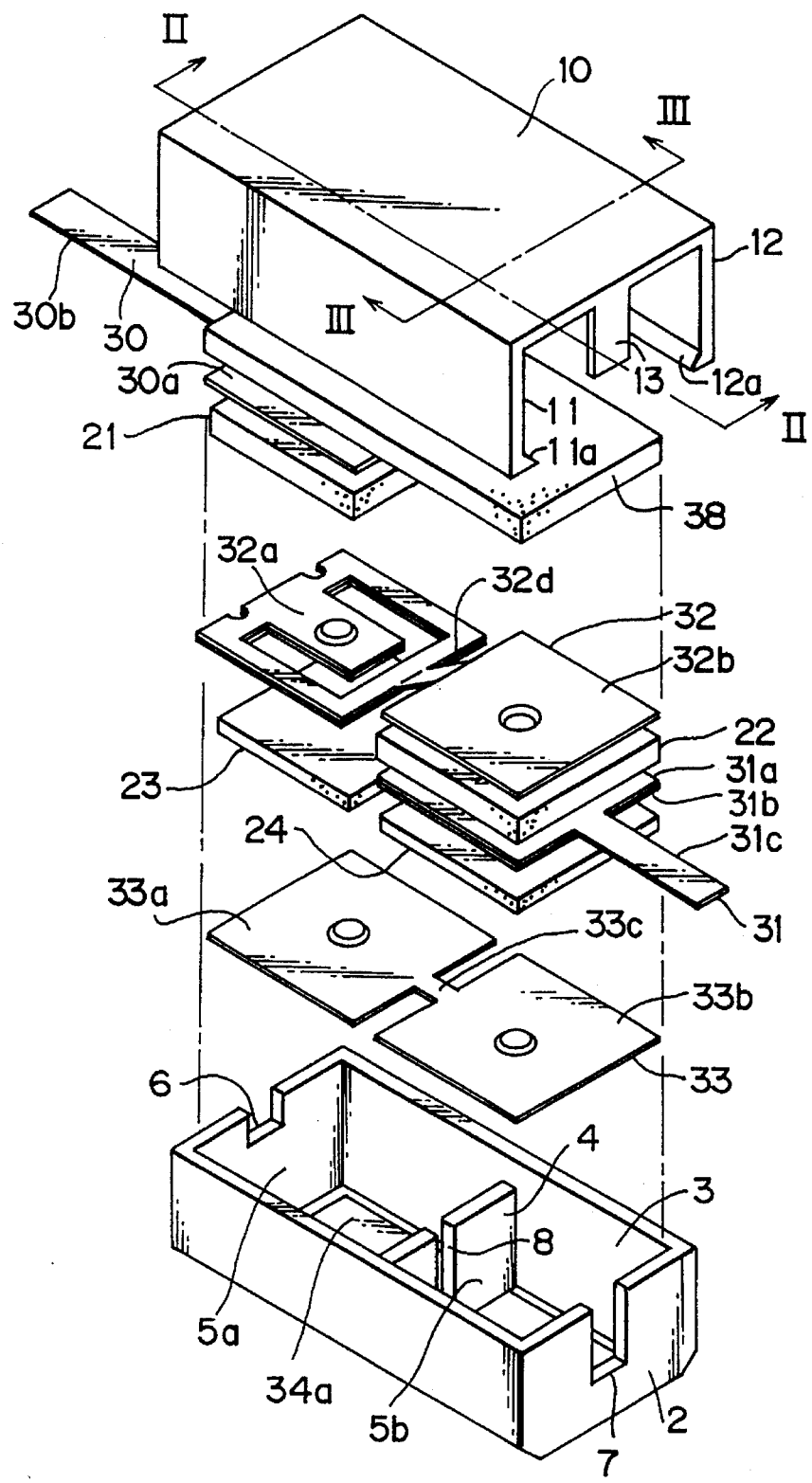
FIG. 1 is an exploded perspective view which shows a ladder filter which is a first embodiment of the present invention.
Figure 2:
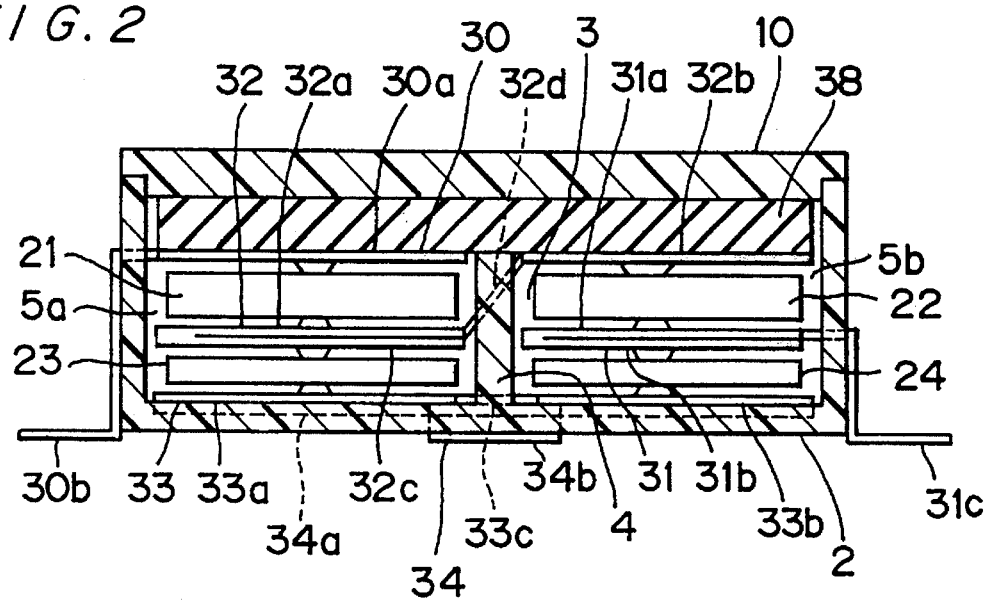
FIG. 2 is a sectional view of the ladder filter shown in FIG. 1, taken along the line II—II.
Figure 3:
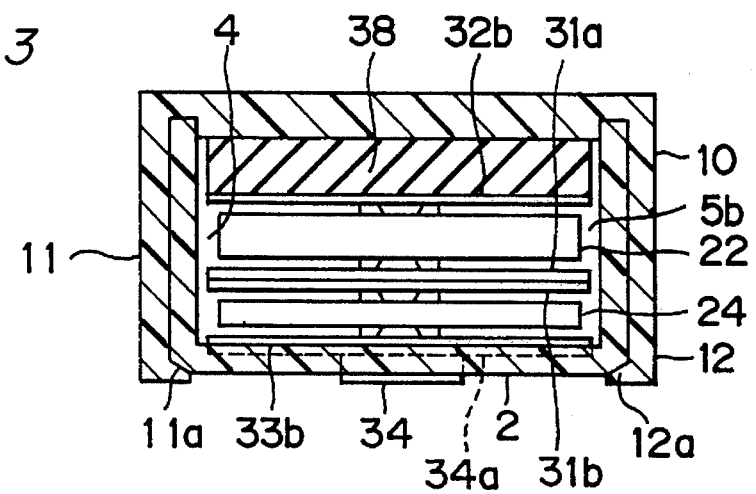
FIG. 3 is a sectional view of the ladder filter shown in FIG. 1, taken along the line III—III.

As shown in FIGS. 1, 2 and 3, a ladder filter which is the first embodiment is mainly composed of an inner case 2, an outer case 10, four piezoresonators 21, 22, 23 and 24, an input terminal 30, an output terminal 31, junction terminals 32 and 33 and a grounding terminal 34. The piezoresonatots 21 through 24 are well-known ones which are provided with vibrating electrodes on their upper and bottom sides.

The inner case 2 has a concave portion 3 which is partitioned by a partition wall 4 into two equal-sized containing portions 5a and 5b. A cutout 6 for fitting in the input terminal 30 is provided at a side wall (rear side in FIG. 1) of the inner case 2 and a cutout 7 for fitting in the output terminal 31 is provided at another side wall. Also, a cutout 8 for fitting in the junction terminals 32 and 33 is provided at the partition wall 4.

The grounding terminal 34 is insert-molded at a bottom of the internal case 2. The grounding terminal 34 has an internal contact portion 34a and an external contact portion 34b. An upper side of the contact portion 34a is exposed at a bottom of the concave portion 3.

The outer case 10 has walls 11 and 12 at both sides, and claw edges 11a and 12a are provided at each lower portion of the walls 11 and 12. A protruding portion 13 is provided at a front end (in FIG. 1) of the outer case 10 to cover the cutout 7 of the inner case 2. Another protruding portion (not shown) is provided at a rear end (in FIG. 1) of the outer case 10 to cover the cutout 6.

The input terminal 30 has a contact portion 30a and an external contact portion 30b. A protruding portion which is provided at the contact portion 30a contacts with the upper side of the piezoresonator 21 with pressure. The output terminal 31 has a twofold contact portion (upper portion 31a and lower portion 31b) and an external contact portion 31c. A protruding portion which is provided at the upper contact portion 31a contacts with the bottom side of the piezoresonator 22 with pressure. Also, a protruding portion which is provided at the lower contact portion 31b contacts with the upper side of the piezoresonator 24 with pressure.

The junction terminal 32 has a twofold contact portion (upper portion 32a and lower portion 32c), a contact portion 32b and a junction portion 32d. A protruding portion which is provided at the upper contact portion 32a contacts with the bottom side of the piezoresonator 21 with pressure. A protruding portion which is provided at the contact portion 32b contacts with the upper side of the piezoresonator 22 with pressure. A protruding portion which is provided at the lower contact portion 32c contacts with the upper side of the piezoresonator 23 with pressure.

The junction terminal 33 has contact portions 33a and 33b and a junction portion 33c. A protruding portion which is provided at the contact portion 33a contacts with the bottom side of the piezoresonator 23 with pressure. A protruding portion which is provided at the contact portion 33b contacts with the bottom side of the piezoresonator 24 with pressure. The contact portions 33a and 33b contact with the contact portion 34a of the grounding terminal 34 with pressure.

The piezoresonators 21 through 24 and terminals 30 through 33 are portioned out into the containing portions 5a and 5b of the internal case 2 and stacked successively thereon. More particularly, after the contact portions 33a and 33b of the junction terminal 33 are inserted in to the containing portions 5a and 5b respectively with the junction portion 33c fitting into the cutout 8, the piezoresonatots 23 and 24 are inserted into the containing portions 5a and 5b respectively. Then, the output terminal 31 and the piezoresonator 22 are inserted into the containing portion 5b successively. At that time, the output terminal 31 is set such that the external contact portion 31c is led from the inner case 2 through the cutout 7.

Further, the contact portions 32a through 32c of the junction terminal 32 are inserted into the containing portions 5a and 5b with the junction portion 32d fitted into the cutout 8, and the piezoresonator 21 and the input terminal 30 are inserted into the containing portion 5a successively. At that time, the input terminal 30 is set such that the external contact portion 30b is led from the inner case 2 through the cutout 6. After a rubber plate 38 for controlling internal pressure is set on the internal components 21 through 24 and 30 through 33, these are covered with the outer case 10. The inner case 2 and the outer case 10 are engaged by the claw edges 11a and 12a. At that time, the inner case 2 and the outer case 10 can be engaged with an adhesive agent if necessary. The external contact portions 30b and 31c of the terminals 30 and 31 are bent in L-shape along the inner case 2 (refer to FIG. 2) to form a surface mounting type ladder filter.

Figure 4:
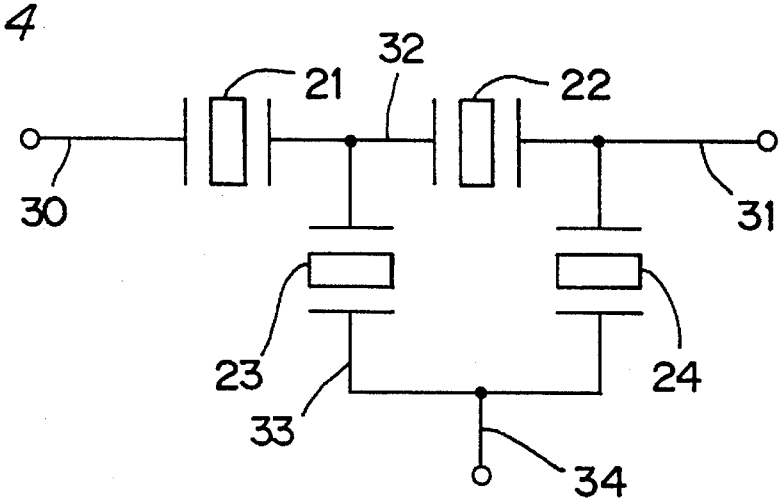
FIG. 4 is a diagram which shows an equivalent circuit of the ladder filter which is the first embodiment of the present invention.

FIG. 4 is a diagram which shows an equivalent circuit of the ladder filter explained above. The piezoresonators 21 and 22 which are connected in series and the piezoresonators 23 and 24 which are connected in parallel form a ladder structure between the input terminal 30 and the output terminal 31. In the filter, since the internal components 21 through 24 and 30 through 33 are portioned out into the two containing portions 5a and 5b, the number of rows of the internal components is smaller than that of the conventional filter. Thus, the ladder filter whose height is shorter than a conventional filter can be provided. Also, since this filter can be assembled by simply providing the internal components 21 through 24 and 30 through 33 successively and stacking them up in the containing portions 5a and 5b, automatic assembly can be done easily.

Second Embodiment: FIGS. 5a, 5b, 5c through 9

As shown in FIGS. 5a, 5b, 5c through 8, a ladder filter which is the second embodiment is mainly composed of an inner case 42, an outer case 51, eight piezoresonators 61 through 68, an input terminal 71, an output terminal 72, junction terminals 74, 75 and 76, a grounding terminal 73 and aeolotropic conductive rubber sheets 79 through 91. The piezoresonators 61 through 68 are well-known ones which are provided with vibrating electrodes on their upper and bottom sides.

Figure 5A:
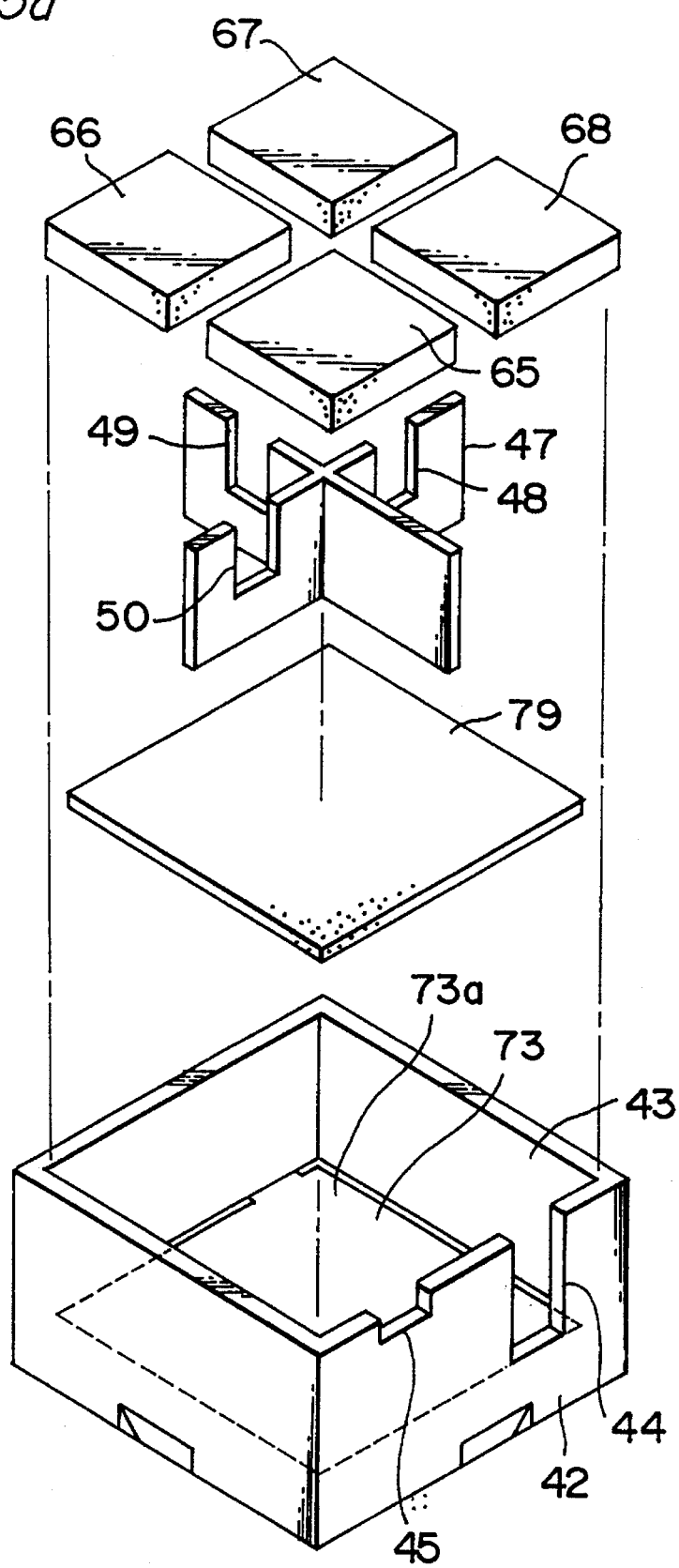
FIGS. 5a, 5b and 5c are exploded perspective views which show a ladder filter which is a second embodiment of the present invention, FIG. 5a showing a lower portion, FIG. 5b showing a middle portion, FIG. 5c showing an upper portion.

As shown in FIG. 5a, the internal case 42 has a concave portion 43. A cutout 45 for fitting the input terminal 71 and a cutout 44 for fitting the output terminal 72 are provided at a side wall of the inner case 42. The grounding terminal 73 is insert-molded at a bottom of the inner case 42 (refer to FIG. 7). The concave portion 43 of the inner case 42 is partitioned by a cross-shaped partition member 47 into four equal-sized containing portions 46a, 46b, 46c and 46d (refer to FIG. 6). Cutouts 48, 49 and 50 are provided at the partition member 47 for fitting junction terminals 74, 75 and 76.

The grounding terminal 73 has a contact portion 73a and an external contact portion 73b. An upper side of the contact portion 73a is exposed at a bottom of the concave portion 43 of the inner case 42. The grounding terminal 73 contacts with the bottom sides of the piezoresonators 65 through 68 via the conductive rubber sheet 79.

Figure 5B:
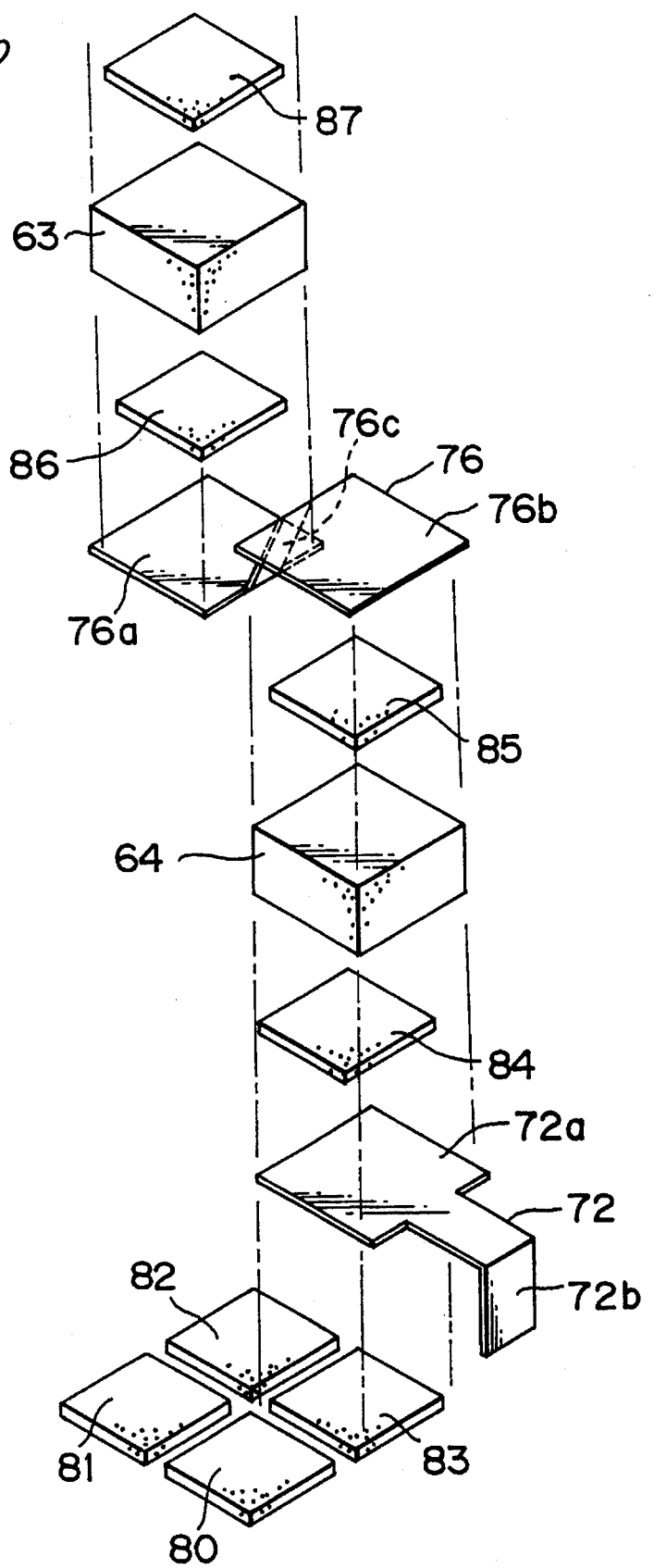
Figure 5C:
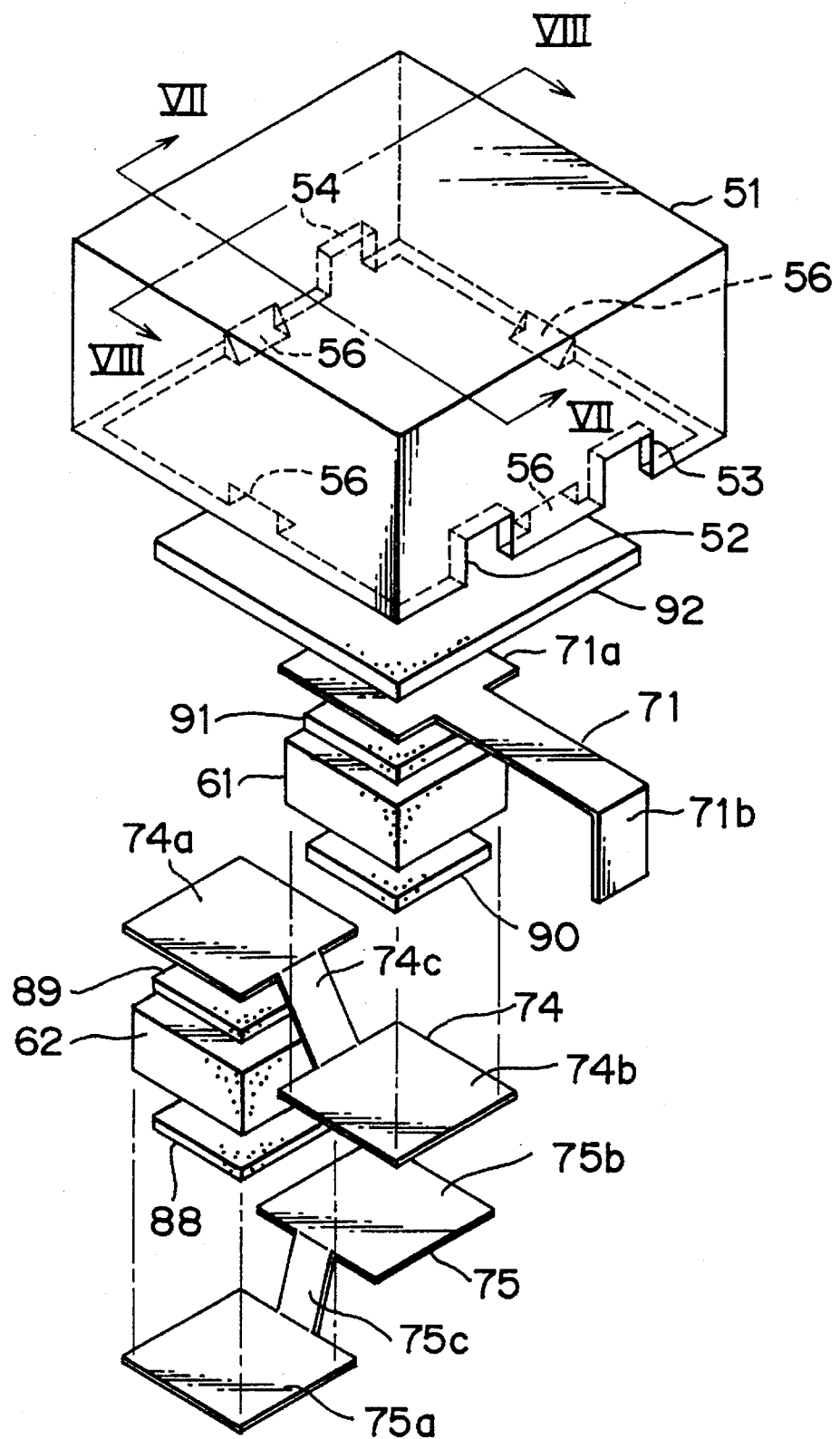
Figure 6:
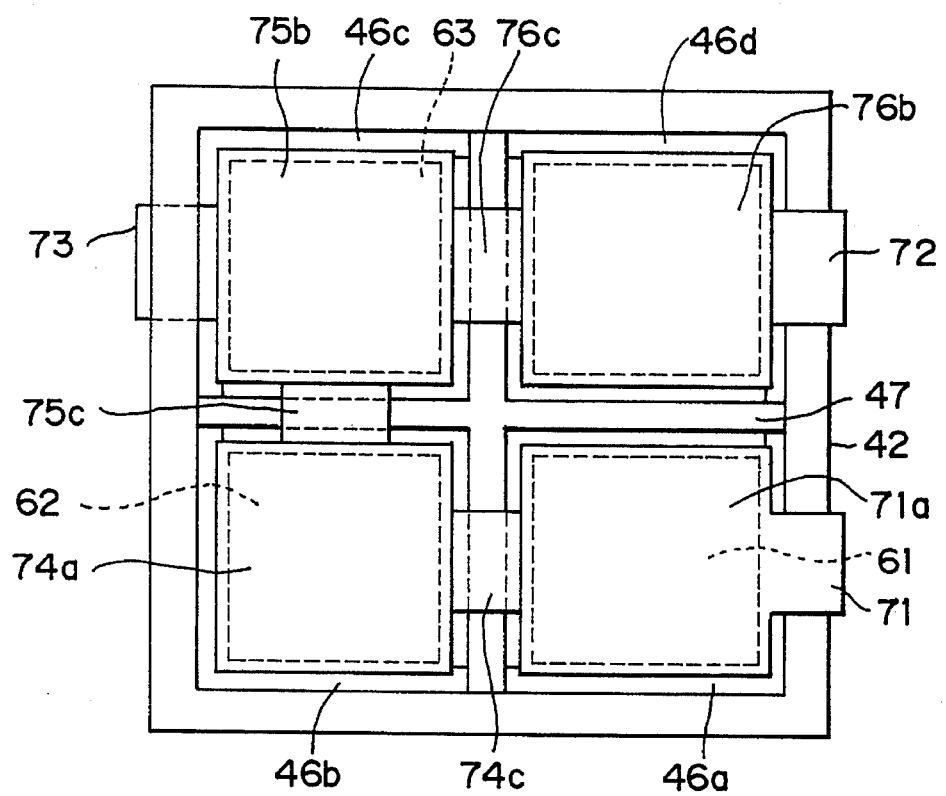
FIG. 6 is a plan view which shows an inside of the ladder filter which is the second embodiment of the present invention.
Figure 7:
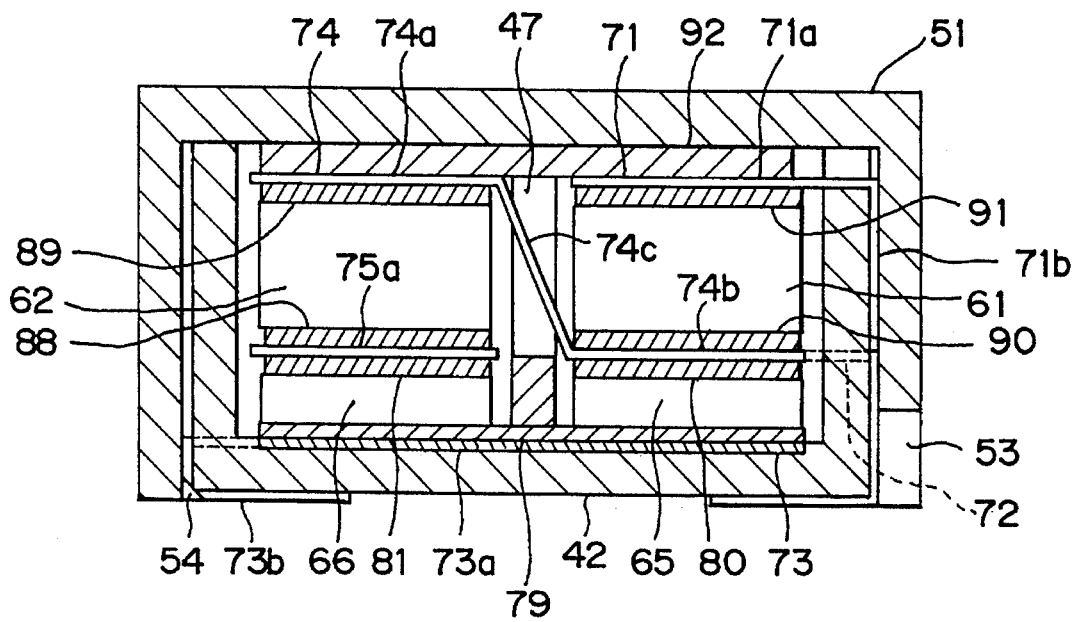
FIG. 7 is a sectional view of the ladder filter shown in FIG. 5c, taken along the line VII—VII.
Figure 8:
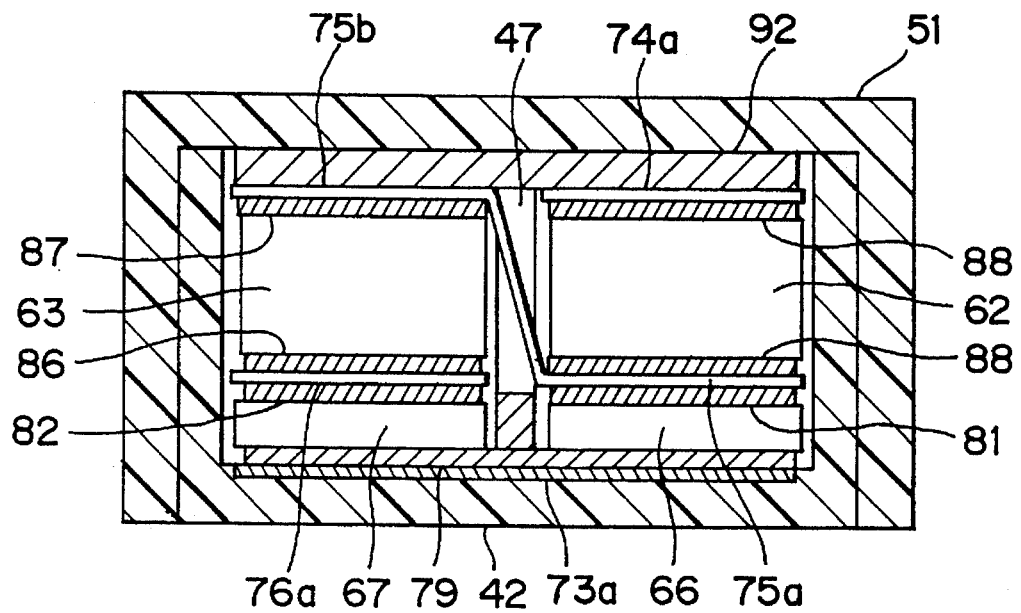
FIG. 8 is a sectional view of the ladder filter shown in FIG. 5c, taken along the line VIII—VIII.

As shown in FIG. 5c, the outer case 51 is box-shaped. A cutout 52 for fitting the input terminal 71 and a cutout 53 for fitting the output terminal 72 are provided at a side wall of the outer case 51, and a cutout 54 for fitting the grounding terminal 73 is provided at the opposite side wall. Also, claws 56 are provided at the lower edges of the side walls of the outer case 51.

The input terminal 71 (refer to FIG. 5c) has a contact portion 71a and an external contact portion 71b, and contacts with the upper side of the piezoresonator 61 through the conductive rubber sheet 91 with pressure. The output terminal 72 (refer to FIG. 5b) has a contact portion 72a and an external contact portion 72b. The output terminal 72 contacts with the upper side of the piezoresonator 68 through the conductive rubber sheet 83 with pressure and also contacts with the bottom side of the piezoresonator 64 through the conductive rubber sheet 84 with pressure.

The junction terminal 74 (refer to FIG. 5c) has contact portions 74a and 74b and a junction portion 74c. The contact portion 74a contacts with the upper side of the piezoresonator 62 through the conductive rubber sheet 89 with pressure. Also, the contact portion 74b contacts with the upper side of the piezoresonator 65 and the bottom side of the piezoresonator 61 through the conductive rubber sheets 80 and 90 respectively with pressure.

The junction terminal 75 (refer to FIG. 5c) has contact portions 75a and 75b and a junction portion 75c. The contact portion 75a contacts with the upper side of the piezoresonator 66 through the conductive rubber sheet 81 and contacts with the bottom side of the piezoresonator 62 through the conductive rubber sheet 88 with pressure. The contact portion 75b contacts with the upper side of the piezoresonator 63 through the conductive rubber sheet 87 with pressure.

The junction terminal 76 (refer to FIG. 5b) has contact portions 76a and 76b and a junction portion 76c. The contact portion 76a contacts with the upper side of the piezoresonator 67 and the bottom side of the piezoresonator 63 through the conductive rubber sheets 82 and 86 respectively with pressure. The contact portion 76b contacts with the upper side of the piezoresonator 64 through the conductive rubber sheet 85 with pressure.

The piezoresonators 61 through 68, the terminals 71, 72, 74, 75 and 76 and the conductive rubber sheets 79 through 91 are portioned out into the containing portions 46a through 46d of the inner case 42 which are partitioned by the partition member 47 and piled up successively. More particularly, as shown in FIG. 5a, the conductive rubber sheet 79 is fitted into the concave portion 43 of the inner case 42, and the partition member 47 is fitted. Then the piezoresonators 65 through 68 are fitted into the containing portions 46a through 46d respectively.

Next, as shown in FIG. 5b, after the conductive rubber sheets 80 through 83 are fitted into the containing portions 46a through 46d respectively, the contact portion 72a of the output terminal 72, the conductive rubber sheet 84, the piezoresonator 64 and the conductive rubber sheet 85 are fitted into the containing portion 46d successively. At that time, the output terminal 72 is set such that the external contact portion 72b is led from the inner case 42 through the cutout 44. Further, the contact portions 76a and 76b of the junction terminal 76 are fitted into the containing portions 46c and 46d respectively such that the junction portion 76c is fitted into the cutout 48 of the partition member 47, and the conductive rubber sheet 86, the piezoresonator 63 and the conductive rubber sheet 87 are fitted into the containing portion 46c successively.

Next, as shown in FIG. 5c, after the contact portions 75a and 75b of the junction terminal 75 are fitted into the containing portions 46b and 46c respectively such that the junction portion 75c is fitted into the cutout 49 of the partition member 47, the conductive rubber sheet 88, the piezoresonator 62 and the conductive rubber sheet 89 are fitted into the containing portion 46b successively.

Further, after the contact portions 74a and 74b of the junction terminal 74 are contained in the containing portions 46b and 46a respectively such that the junction portion 74c is fitted into the cutout 50 of the partition member 47, the conductive rubber sheet 90, the piezoresonator 61, the conductive rubber sheet 91 and the contact portion 71a of the input terminal 71 are fitted into the containing portion 46a successively. At that time, the input terminal 71 is set such that the external contact portion 71b is led from the internal case 42 through the cutout 45.

Next, the external contact portions 71b and 72b of the terminals 71 and 72 are bent along the side and the bottom side of the internal case 42 (refer to FIG. 7) to form a surface mounting type ladder filter.

After a spacer 92 made of fluorine containing resin is set on the internal components 61 through 68, 71, 72, 74 through 76, 79 through 91 which are piled up, these internal components are covered with the outer case 51. Then the inner case 42 and the outer case 51 are engaged by the edges 54. At this time, an adhesive agent can be used if necessary.

Figure 9:
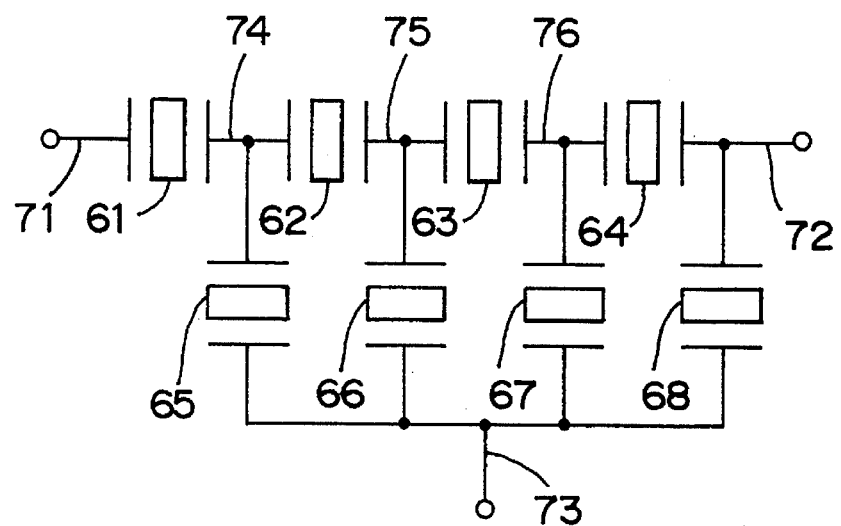
FIG. 9 is a diagram which shows an equivalent circuit of the ladder filter which is the second embodiment.

FIG. 9 is a diagram which shows an equivalent circuit of the ladder filter obtained in the above way. The piezoresonators 61 through 64 which are connected in series and the piezoresonators 65 through 68 which are connected in parallel form a ladder structure between the input terminal 71 and the output terminal 72. This filter has the same operation and effect as the filter of the first embodiment.

Other Embodiments

Although the present invention has been described in connection with the preferred embodiments above, it is to be noted that various changes and modifications are apparent to a person skilled in the art. Such changes and modifications are to be understood as being within the scope of the present invention.

Particularly, the number of the piezoresonators is optional, and it can be more than 10 besides four and eight.

What is claimed is:

1. A ladder filter comprising:

a box-type case made of an insulating material;

a grounding terminal comprising a conductive thin flat plate contained in the case at a bottom thereof;

a conductive elastic sheet contained in the case such that one side of the conductive elastic sheet is entirely in contact with the grounding terminal;

a partition member with a plurality of cut-outs contained in the case vertically on the conductive elastic sheet, the partition member dividing an inside of the case into a plurality of containing portions;

a plurality of parallel piezoresonators contained in the containing portions of the case, each of the parallel piezoresonators being disposed such that one side is entirely in contact with the conductive elastic sheet;

a plurality of series piezoresonators contained in the containing portion of the case above the parallel piezoresonators;

a plurality of junction terminals inserted in the cutouts of the partition member and contained in the containing portions of the case, the junction terminal connecting the parallel piezoresonators with the series piezoresonators electrically;

an input terminal contained in one of the containing portions, the input terminal being electrically connected with the series piezoresonator contained in the same containing portion; and an output terminal contained in another containing portion, the output terminal being electrically connected with the series piezoresonator contained in the same containing portion.

2. The ladder filter as claimed in claim 1, wherein external contact portions of the input terminal, the output terminal and the grounding terminal are led outside of the case and bent parallel with a bottom side of the case.

3. The ladder filter as claimed in claim 1, wherein the case has an opening in the top for insertion of the piezoresonators and terminals inside the case.

* * * * *